(12) United States Patent
Kim et al.

(10) Patent No.: US 10,629,842 B2
(45) Date of Patent: Apr. 21, 2020

(54) DISPLAY DEVICE AND METHOD OF FABRICATING THE SAME

(71) Applicant: Samsung Display Co., Ltd., Yongin-Si, Gyeonggi-Do (KR)

(72) Inventors: Cha-dong Kim, Seoul (KR); Bumsoo Kam, Yongin-si (KR); Hyunae Kim, Seoul (KR); Cheolho Park, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 4 days.

(21) Appl. No.: 15/866,320

(22) Filed: Jan. 9, 2018

(65) Prior Publication Data

US 2019/0019983 A1 Jan. 17, 2019

(30) Foreign Application Priority Data

Jul. 17, 2017 (KR) .................. 10-2017-0090462

(51) Int. Cl.
*H01L 51/52* (2006.01)
*H01L 27/32* (2006.01)
*H01L 51/56* (2006.01)

(52) U.S. Cl.
CPC ...... *H01L 51/5237* (2013.01); *H01L 27/3276* (2013.01); *H01L 51/5203* (2013.01); *H01L 51/5256* (2013.01); *H01L 27/3244* (2013.01); *H01L 51/5253* (2013.01); *H01L 51/5268* (2013.01); *H01L 51/56* (2013.01)

(58) Field of Classification Search
CPC ............ H01L 51/5237; H01L 51/5203; H01L 51/5256; H01L 27/3276; H01L 21/311; H01L 21/31116; H01L 21/32136; H01L 51/5253; H01L 51/56
USPC .......................................................... 257/99
See application file for complete search history.

(56) References Cited

U.S. PATENT DOCUMENTS 9,257,674 B2    2/2016  Lee et al.
2005/0287688 A1*  12/2005  Won .................. C23C 8/36
                                                      438/22

(Continued)

FOREIGN PATENT DOCUMENTS

KR      10-2006-0087145 A     8/2006
KR         10-0659119 B1     12/2006

(Continued)

*Primary Examiner* — Patricia D Reddington
(74) *Attorney, Agent, or Firm* — Lewis Roca Rothgerber Christie LLP

(57) ABSTRACT

A display device may include an organic light emitting device and an encapsulation structure provided on the organic light emitting device to seal the organic light emitting device. The encapsulation structure may include a first inorganic encapsulation layer provided on the organic light emitting device, an organic encapsulation layer provided on the first inorganic encapsulation layer, and a second inorganic encapsulation layer provided on the organic encapsulation layer. The first inorganic encapsulation layer may include a first inorganic layer provided on the organic light emitting device and a first plasma-treated layer provided on the first inorganic layer. The first plasma-treated layer may include an upper portion, in which a rugged structure is defined.

16 Claims, 13 Drawing Sheets
(3 of 13 Drawing Sheet(s) Filed in Color)

(56) References Cited

U.S. PATENT DOCUMENTS

| | | | | |
|---|---|---|---|---|
| 2011/0121469 | A1* | 5/2011 | Blander | H01L 23/295 |
| | | | | 257/788 |
| 2012/0256201 | A1* | 10/2012 | Lee | H01L 51/5256 |
| | | | | 257/88 |
| 2014/0024180 | A1* | 1/2014 | Choi | H01L 21/02107 |
| | | | | 438/127 |
| 2015/0060797 | A1* | 3/2015 | Lee | H01L 51/0003 |
| | | | | 257/40 |
| 2015/0221518 | A1 | 8/2015 | Terakura et al. | |
| 2016/0164046 | A1* | 6/2016 | Uezawa | H01L 51/5281 |
| | | | | 257/40 |
| 2016/0322604 | A1* | 11/2016 | Ho | H01L 27/3244 |
| 2017/0008843 | A1 | 1/2017 | Kwon et al. | |

FOREIGN PATENT DOCUMENTS

| | | |
|---|---|---|
| KR | 10-2012-0113555 A | 10/2012 |
| KR | 10-1549262 B1 | 9/2015 |
| KR | 10-1679371 B1 | 11/2016 |
| KR | 10-2017-0005636 A | 1/2017 |
| KR | 10-1711919 B1 | 3/2017 |
| KR | 10-1712438 B1 | 3/2017 |

* cited by examiner

DISPLAY DEVICE AND METHOD OF FABRICATING THE SAME

CROSS-REFERENCE TO RELATED APPLICATION

This patent application claims priority to and the benefit of Korean Patent Application No. 10-2017-0090462, filed on Jul. 17, 2017 in the Korean Intellectual Property Office, the entire content of which is hereby incorporated by reference.

BACKGROUND

1. Field

Aspects of embodiments of the present disclosure relate to a display device and a method of fabricating the same.

2. Description of the Related Art

An organic light emitting display device includes an organic light emitting device, which is composed of an anode, an organic light emitting layer, and a cathode. The organic light emitting layer is vulnerable to moisture or oxygen. For example, in a case in which external moisture or oxygen is infiltrated into the organic light emitting display device, the light emitting layer may be deteriorated and cause various failures, such as dark spot and pixel shrinkage. Thus, an encapsulation structure is used to protect the organic light emitting device.

SUMMARY

According to aspects of embodiments, a highly-reliable display device configured to check the presence or absence of a failure, and a method of fabricating the same, are provided.

According to an aspect of some embodiments of the inventive concept, a display device is configured to examine whether an encapsulation structure has a failure and thereby to have improved reliability.

According to aspects of some embodiments of the inventive concept, a method of examining whether failure occurs in an encapsulation structure during its fabrication process and a method of fabricating a highly-reliable display device using the same are provided.

According to some embodiments of the inventive concept, a display device may include an organic light emitting device and an encapsulation structure provided on the organic light emitting device to seal the organic light emitting device. The encapsulation structure may include a first inorganic encapsulation layer provided on the organic light emitting device, an organic encapsulation layer provided on the first inorganic encapsulation layer, and a second inorganic encapsulation layer provided on the organic encapsulation layer. The first inorganic encapsulation layer may include a first inorganic layer provided on the organic light emitting device and a first plasma-treated layer provided on the first inorganic layer. The first plasma-treated layer may include an upper portion in which a rugged structure is defined.

In some embodiments, the rugged structure may be defined in a surface that is spaced apart from the first inorganic layer and adjacent to the organic encapsulation layer.

In some embodiments, the rugged structure may have a root mean square (RMS) surface roughness from 10 nm to 90 nm.

In some embodiments, the organic encapsulation layer may be in contact with a top surface of the first plasma-treated layer.

In some embodiments, the organic encapsulation layer may be in contact with the rugged structure of the first plasma-treated layer.

In some embodiments, the first plasma-treated layer may be treated by plasma of nitrogen trifluoride ($NF_3$) gas.

In some embodiments, a hydrophobicity of the first plasma-treated layer may be higher than a hydrophobicity of the first inorganic layer.

In some embodiments, the second inorganic encapsulation layer may include a second inorganic layer provided on the organic encapsulation layer and a second plasma-treated layer provided on the second inorganic layer. The second plasma-treated layer may include an upper portion, in which a rugged structure is defined.

In some embodiments, each of the first inorganic encapsulation layer and the second inorganic encapsulation layer may include at least one of silicon oxide ($SiOx$), silicon nitride ($SiNx$), or silicon oxynitride ($SiOxNy$).

In some embodiments, the first plasma-treated layer forms a single body together with the first inorganic layer.

According to some embodiments of the inventive concept, a method of fabricating a display device may include preparing an organic light emitting device and forming an encapsulation structure to seal the organic light emitting device. The forming of the encapsulation structure may include forming a first inorganic encapsulation layer on the organic light emitting device, coating the first inorganic encapsulation layer with an organic material to form an organic encapsulation layer, and forming a second inorganic encapsulation layer on the organic encapsulation layer. The forming of the first inorganic encapsulation layer may include depositing an inorganic material on the organic light emitting device to form a first base inorganic layer and performing a plasma treatment process on a surface of the first base inorganic layer to form a first plasma-treated layer.

In some embodiments, in the forming of the first plasma-treated layer, the plasma treatment process may be performed using nitrogen trifluoride ($NF_3$) gas.

In some embodiments, in the forming of the first plasma-treated layer, the plasma treatment process may be performed to form a rugged structure on a surface of the first base inorganic layer.

In some embodiments, the rugged structure may be formed to have a root mean square (RMS) surface roughness from 10 nm to 90 nm.

In some embodiments, the forming of the first inorganic encapsulation layer further includes performing an ashing process on the surface of the first base inorganic layer, before the formation of the first plasma-treated layer.

In some embodiments, the forming of the second inorganic encapsulation layer may include depositing an inorganic material on the organic encapsulation layer to form a second base inorganic layer and performing a plasma treatment process on a surface of the second base inorganic layer to form a second plasma-treated layer.

In some embodiments, in the forming of the organic encapsulation layer, the organic material may be directly coated on the first inorganic encapsulation layer using an inkjet process.

BRIEF DESCRIPTION OF THE DRAWINGS

The patent or application file contains at least one drawing executed in color. Copies of this patent or patent application publication with color drawings will be provided by the Office upon request and payment of the necessary fee.

Example embodiments will be more clearly understood from the following description taken in conjunction with the accompanying drawings. The accompanying drawings represent some non-limiting, example embodiments as described herein.

Figure 1A:
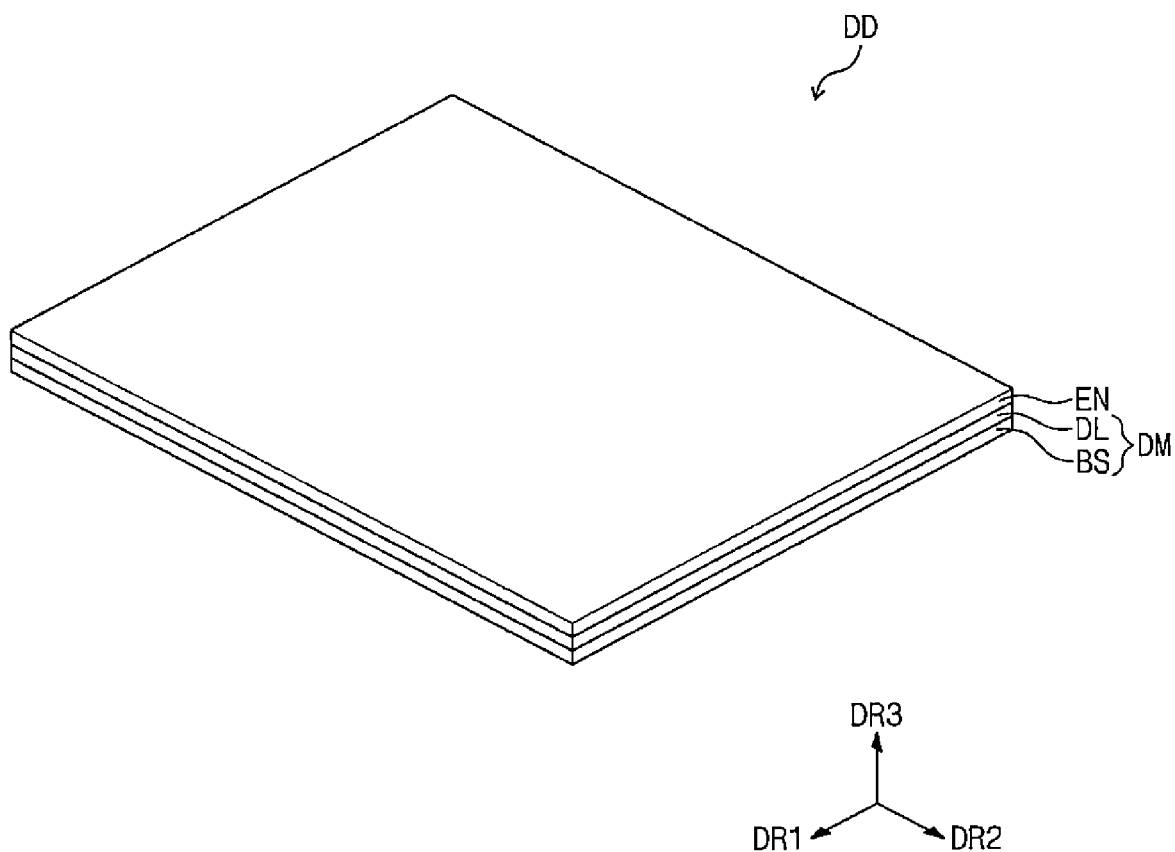
FIG. 1A is a perspective view illustrating an assembled structure of a display device according to some embodiments of the inventive concept.

It should be noted that these figures are intended to illustrate general characteristics of methods, structures, and/or materials utilized in certain example embodiments and to supplement the written description provided below. These drawings may not, however, be to scale and may not precisely reflect the precise structural or performance characteristics of any given embodiment, and should not be interpreted as defining or limiting the range of values or properties encompassed by example embodiments. For example, relative thicknesses and positioning of components, layers, regions, and/or structural elements may be reduced or exaggerated for clarity. The use of similar or same reference numbers in the various drawings is intended to indicate the presence of a similar or same element or feature.

DETAILED DESCRIPTION

Some example embodiments of the inventive concept will now be described more fully with reference to the accompanying drawings, in which some example embodiments are shown. Example embodiments of the inventive concept may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions may be exaggerated for clarity. Like reference numerals in the drawings denote like elements, and, thus, repeated description will be omitted.

It is to be understood that when an element is referred to as being "connected" or "coupled" to another element, it can be directly connected or coupled to the other element or one or more intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It is to be understood that, although the terms "first," "second," etc. may be used herein to describe various elements, components, regions, layers, and/or sections, these elements, components, regions, layers, and/or sections should not be limited by these terms. Rather, these terms are used to distinguish one element, component, region, layer, or section from another element, component, region, layer, or section. Thus, a "first" element, component, region, layer, or section discussed below could be termed a "second" element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented above the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

The terminology used herein is for the purpose of describing particular embodiments and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," as used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments of the inventive concept belong. It will be further understood that terms, such as those defined in commonly-used dictionaries, should be interpreted as having a meaning that is consistent with their meaning in the context of the relevant art and are not to be interpreted in an idealized or overly formal sense unless expressly so defined herein.

Figure 1B:
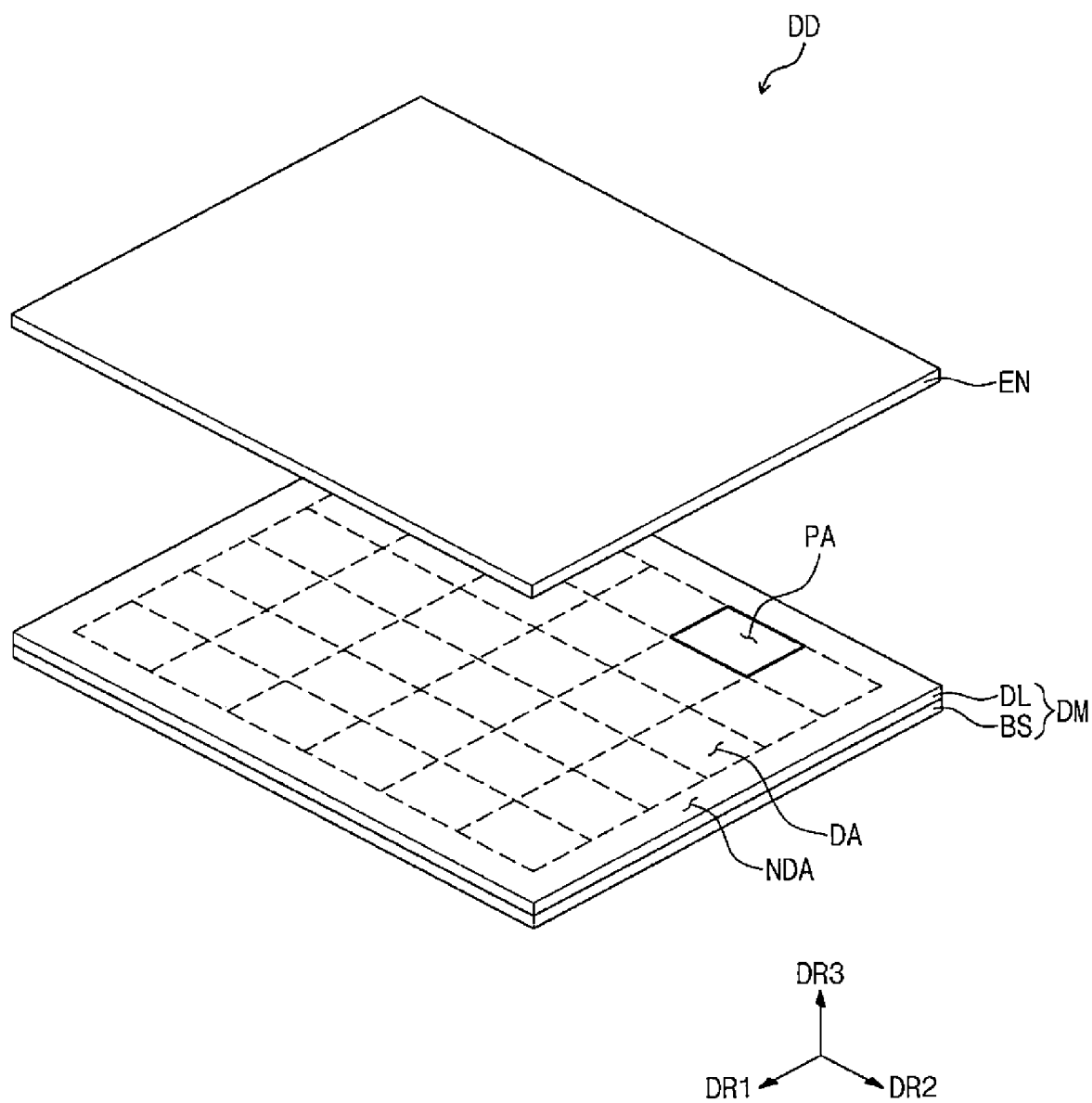
FIG. 1B is an exploded perspective view illustrating a display device according to some embodiments of the inventive concept.
Figure 2:
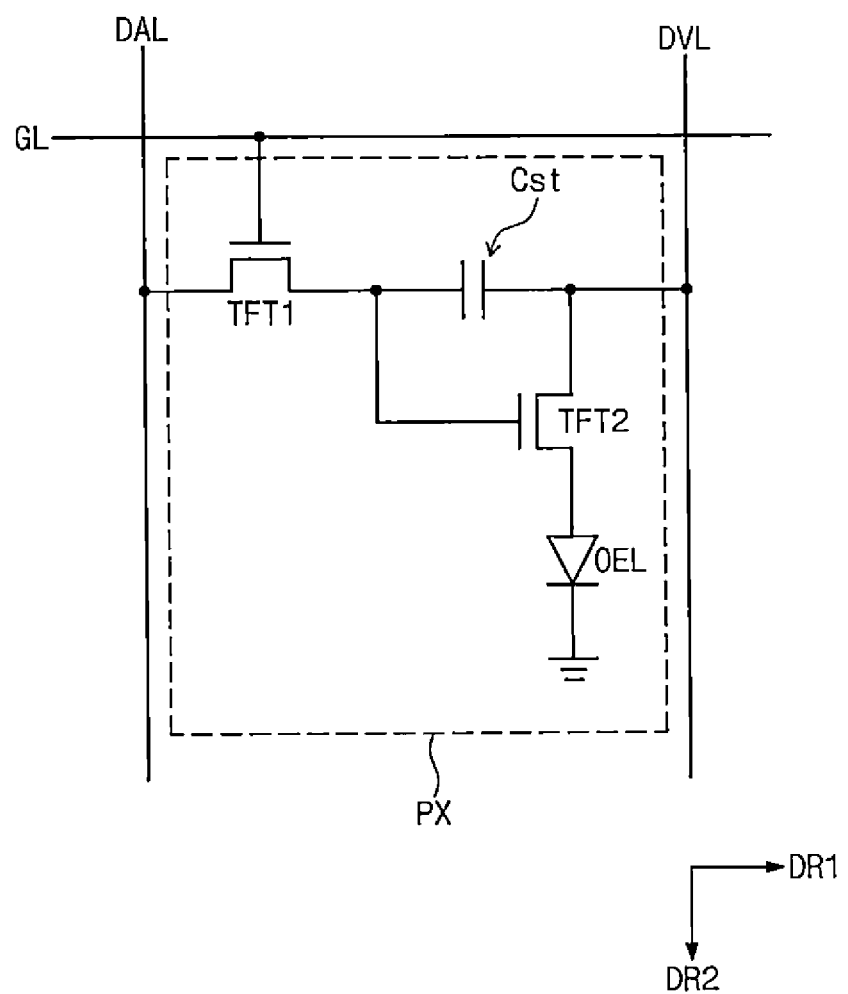
FIG. 2 is a circuit diagram illustrating one of pixels in a display device according to some embodiments of the inventive concept.

FIG. 1A is a perspective view illustrating an assembled structure of a display device according to some embodiments of the inventive concept. FIG. 1B is an exploded perspective view illustrating a display device according to some embodiments of the inventive concept. FIG. 2 is a circuit diagram illustrating one of pixels in a display device according to some embodiments of the inventive concept. Herein, a display device DD according to some embodiments of the inventive concept will be described with reference to FIGS. 1A to 2.

Referring to FIGS. 1A and 1B, the display device DD may include a display structure DM and an encapsulation structure EN.

The display structure DM may include a display region DA and a non-display region NDA. The display region DA may be configured to display an image. In an embodiment, when viewed in a thickness direction DR3 of the display device DD, the display region DA may have a generally rectangular shape, but the inventive concept is not limited thereto.

The display region DA may include a plurality of pixel regions PA. The pixel regions PA may be arranged in a matrix shape. The pixel regions PA may be defined by a pixel definition layer PDL (e.g., see FIG. 3). The pixel regions PA may include a plurality of pixels PX (e.g., see FIG. 2), respectively. Each of the pixels PX may include an organic light emitting device OEL (e.g., see FIG. 2).

The non-display region NDA may not be used to display an image. When viewed in the thickness direction DR3 of the display device DD, the non-display region NDA may be provided to surround the display region DA, for example. The non-display region NDA may be adjacent to the display region DA in a first direction DR1 and a second direction DR2.

The display structure DM may include a base member BS and a display layer DL provided on the base member BS.

The base member BS may be a substrate that is formed of an insulating material (e.g., glass, plastic, quartz, etc.). The display layer DL may include a plurality of pixels. The pixels may be configured to emit light in response to electrical signals applied thereto.

Referring to FIG. 2, each of the pixels PX may be connected to an interconnection structure including a gate line GL, a data line DAL, and a driving voltage line DVL. Each of the pixels PX may include thin-film transistors TFT1 and TFT2, which are connected to the interconnection structure, and the organic light emitting device OEL and a capacitor Cst, which are connected to the thin-film transistors TFT1 and TFT2.

The gate line GL may extend in the first direction DR1. The data line DAL may extend in the second direction DR2 crossing the gate line GL. The driving voltage line DVL may extend in substantially the same direction as an extension direction of the data line DAL (e.g., in the second direction DR2). The gate line GL may be used to transmit scan signals to the thin-film transistors TFT1 and TFT2, the data line DAL may be used to transmit data signals to the thin-film transistors TFT1 and TFT2, and the driving voltage line DVL may be used to transmit a driving voltage to the thin-film transistors TFT1 and TFT2.

The thin-film transistors TFT1 and TFT2 may include a driving thin-film transistor TFT2, which is used to control the organic light emitting device OEL, and a switching thin-film transistor TFT1, which is used to control a switching operation of the driving thin-film transistor TFT2. As described above, each of the pixels PX may include two thin-film transistors TFT1 and TFT2, but the inventive concept is not limited thereto. For example, each of the pixels PX may include a single thin-film transistor and a single capacitor. In certain embodiments, each of the pixels PX may include three or more thin-film transistors and two or more capacitors.

Although not shown, the switching thin-film transistor TFT1 may include a first gate electrode, a first source electrode, and a first drain electrode. The first gate electrode may be connected to the gate line GL, and the first source electrode may be connected to the data line DAL. The first drain electrode may be connected to a first common electrode through a contact hole. The switching thin-film transistor TFT1 may be configured to transmit the data signals from the data line DAL to the driving thin-film transistor TFT2, depending on the scan signals applied to the gate line GL.

The organic light emitting device OEL may include a first electrode, which is connected to the driving thin-film transistor TFT2, and a second electrode, which is configured to receive a second power voltage. The organic light emitting device OEL may further include a light-emitting pattern provided between the first electrode and the second electrode.

The organic light emitting device OEL may be configured to emit light, when the driving thin-film transistor TFT2 is turned-on. Color (i.e. wavelength) of light emitted from the organic light emitting device OEL may be determined by a material of the light-emitting pattern. For example, the organic light emitting device OEL may be configured to emit light of which color is one of red, green, blue, and white, but the inventive concept is not limited thereto.

Referring back to FIGS. 1A and 1B, the encapsulation structure EN may be provided on the display structure DM. The encapsulation structure EN may be provided to cover the display layer DL. The encapsulation structure EN may be configured to protect the display layer DL against moisture or contamination from the outside. The encapsulation structure EN will be described in more detail below.

Figure 3:
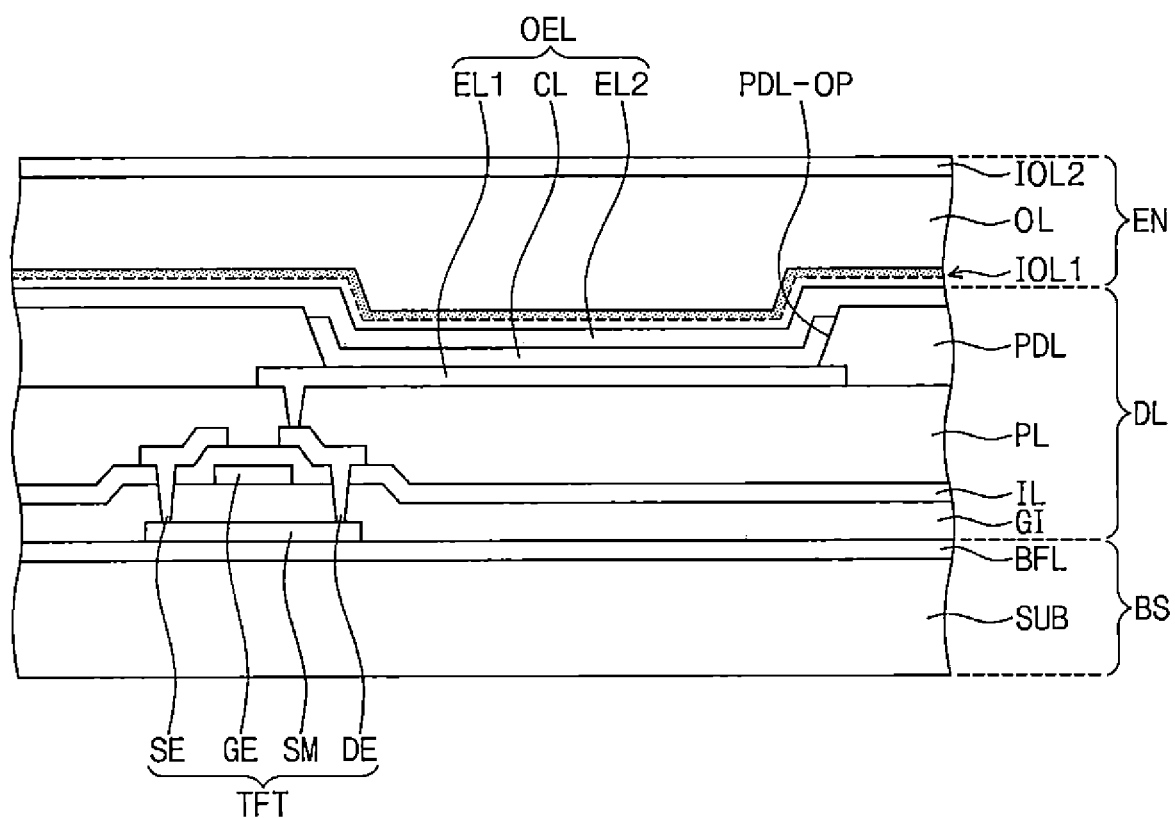
FIG. 3 is a cross-sectional view schematically illustrating a portion of a vertical section of a display device according to some embodiments of the inventive concept.

FIG. 3 is a cross-sectional view schematically illustrating a portion of a vertical section of a display device according to some embodiments of the inventive concept.

Referring to FIG. 3, a display device may include the base member BS, the display layer DL, and the encapsulation structure EN.

The base member BS may include a base layer SUB and a buffer layer BFL. The base layer SUB may be formed of an insulating material (e.g., glass, plastic, quartz, etc.), but it is not particularly limited. The base layer SUB may include an organic polymer, such as any of polyethylene terephthalate (PET), polyethylene naphthalate (PEN), polyimide, and polyether sulfone. A material for the base layer SUB may be selected in consideration of various physical or chemical properties, such as mechanical strength, thermal stability, transparency, surface flatness, tractability, and waterproofing property.

A functional layer may be provided on the base layer SUB. FIG. 3 illustrates an example in which the buffer layer BFL is used as the functional layer, but the functional layer may include a barrier layer. The buffer layer BFL may be used to improve adhesion characteristics between the base member BS and the display layer DL, and the barrier layer may be used to prevent or substantially prevent an extraneous material from being infiltrated into the display layer DL.

The display layer DL may include a thin-film transistor TFT and the organic light emitting device OEL.

The thin-film transistor TFT may include a driving thin-film transistor, which is used to control the organic light emitting device OEL, and a switching thin-film transistor, which is used to control a switching operation of the driving thin-film transistor.

The thin-film transistor TFT may include a semiconductor layer SM, a gate electrode GE, a source electrode SE, and a drain electrode DE. The semiconductor layer SM may be formed of a semiconductor material and may be used as an active layer of the thin-film transistor TFT. The semiconductor layer SM may be formed of or include at least one of inorganic or organic semiconductor materials.

A gate insulating layer GI may be provided on the semiconductor layer SM. The gate insulating layer GI may be provided to cover the semiconductor layer SM. The gate insulating layer GI may be formed of or include at least one of organic or inorganic insulating materials.

The gate electrode GE may be provided on the gate insulating layer GI. The gate electrode GE may be formed to cover a region corresponding to a channel region of the semiconductor layer SM.

The source electrode SE and the drain electrode DE may be provided on an interlayered insulating layer IL. The drain electrode DE may be in contact with a drain region of the semiconductor layer SM through a contact hole, which is formed to penetrate the gate insulating layer GI and the interlayered insulating layer IL, and the source electrode SE may be in contact with a source region of the semiconductor layer SM through a contact hole, which is formed to penetrate the gate insulating layer GI and the interlayered insulating layer IL.

A passivation layer PL may be provided on the source electrode SE, the drain electrode DE, and the interlayered insulating layer IL. The passivation layer PL may serve as a protection layer for protecting the thin-film transistor TFT and may serve as a planarization layer providing a flat top surface.

The organic light emitting device OEL may be provided on the passivation layer PL.

The organic light emitting device OEL may include a first electrode EL1, a second electrode EL2 provided on the first electrode EL1, and an intermediate layer CL provided between the first electrode EU and the second electrode EL2.

The first electrode EL1 may be used as a pixel electrode or a positive terminal. The first electrode EL1 may be a transparent electrode, a transflective electrode, or a reflective electrode. The first electrode EL1 may be formed of or include a conductive compound containing at least one of metals, metal alloys, or metal oxides. The first electrode EL1 may be formed of or include a transparent metal oxide (e.g., indium tin oxide (ITO), indium zinc oxide (IZO), zinc oxide (ZnO), or indium tin zinc oxide (ITZO)). The first electrode EL1 may be formed of or include at least one of Ag, Mg, Cu, Al, Pt, Pd, Au, Ni, Nd, Ir, Cr, Li, Ca, LiF/Ca, LiF/Al, Mo, Ti, compounds or mixtures thereof (e.g., a mixture of Ag and Mg). Alternatively, the first electrode EL1 may be provided to have a multi-layered structure including a reflective or transflective layer (e.g., of any of the above materials) and a transparent conductive layer (e.g., of indium tin oxide (ITO), indium zinc oxide (IZO), zinc oxide (ZnO), or indium tin zinc oxide (ITZO)).

The second electrode EL2 may be a common electrode or a negative terminal. The second electrode EL2 may be a transparent electrode, a transflective electrode, or a reflective electrode. The second electrode EL2 may be formed of or include a conductive compound containing at least one of metals, metal alloys, or metal oxides. The second electrode EL2 may be formed of or include a transparent metal oxide (e.g., indium tin oxide (ITO), indium zinc oxide (IZO), zinc oxide (ZnO), or indium tin zinc oxide (ITZO)). The second electrode EL2 may be formed of or include at least one of Ag, Mg, Al, Pt, Pd, Au, Ni, Nd, Ir, Cr, Li, Ca, LiF/Ca, LiF/Al, Mo, Ti, compounds or mixtures thereof (e.g., a mixture of Ag and Mg). Alternatively, the second electrode EL2 may be provided to have a multi-layered structure including a reflective or transflective layer (e.g., of any of the above materials) and a transparent conductive layer (e.g., of indium tin oxide (ITO), indium zinc oxide (IZO), zinc oxide (ZnO), or indium tin zinc oxide (ITZO)).

In some embodiments, the first electrode EU may be a reflective electrode, and the second electrode EL2 may be a transflective or transparent electrode. The display device DD may be configured to include the organic light emitting device OEL that is of a top-emission type. However, the inventive concept is not limited thereto, and the organic light emitting device OEL may be of a bottom-emission type.

The pixel definition layer PDL may be placed on the first electrode EL1. For example, the pixel definition layer PDL may be provided to cover a portion of the first electrode EL1 and to expose another portion of the first electrode EL1.

The pixel definition layer PDL may be provided to define an opening PDL-OP. The opening PDL-OP of the pixel definition layer PDL may define a light-emitting region.

The intermediate layer CL may be provided between the first electrode EL1 and the second electrode EL2. The intermediate layer CL may include a light emitting layer. The intermediate layer CL may further include a plurality of organic layers, in addition to the light emitting layer. For example, the intermediate layer CL may include a hole injection layer, a hole transport layer, a light emitting layer, an electron transport layer, and an electron injection layer, which are sequentially stacked on the base layer SUB. In certain embodiments, the intermediate layer CL may further include at least one of a hole prevention layer, a hole buffer layer, or an electron prevention layer.

The intermediate layer CL may be provided in the opening PDL-OP of the pixel definition layer PDL. The intermediate layer CL may be overlapped with the light-emitting region defined by the opening PDL-OP of the pixel definition layer PDL. FIG. 3 illustrates an example in which the intermediate layer CL is patterned to be positioned within the opening PDL-OP of the pixel definition layer PDL, but the inventive concept is not limited thereto. For example, at least one of the layers constituting the intermediate layer CL may be used as a common layer, which is provided on, and overlapped (e.g., wholly overlapped) with, the first electrode EL1 and the pixel definition layer PDL.

The encapsulation structure EN may include a first inorganic encapsulation layer IOL1, an organic encapsulation layer OL provided on the first inorganic encapsulation layer IOL1, and a second inorganic encapsulation layer IOL2 provided on the organic encapsulation layer OL. The encapsulation structure EN may be provided on the organic light emitting device OEL and may be used to seal the organic light emitting device OEL.

The first inorganic encapsulation layer IOL1 may be provided on the display structure DM. The first inorganic encapsulation layer IOL1 may be provided on the organic light emitting device OEL. For example, the first inorganic encapsulation layer IOL1 may be provided to be in contact with a top surface of the second electrode EL2 of the organic light emitting device OEL. The first inorganic encapsulation layer IOL1 may be placed to be overlapped with the organic light emitting device OEL and the pixel definition layer PDL.

The first inorganic encapsulation layer IOL1 may be formed of or include an inorganic material. The first inorganic encapsulation layer IOL1 may be an inorganic thin film containing an inorganic material. The inorganic material may include at least one of, for example, silicon oxide (SiOx), silicon nitride (SiNx), or silicon oxynitride (Si- OxNy), but the inventive concept is not limited thereto. The first inorganic encapsulation layer IOL1 may be used to seal the organic light emitting device OEL and may also serve as a barrier layer preventing or substantially preventing an extraneous material from infiltrating into the organic light emitting device OEL.

The organic encapsulation layer OL may be provided on the first inorganic encapsulation layer IOL1. The organic encapsulation layer OL may be provided to be in contact with a top surface of the first inorganic encapsulation layer IOL1. The organic encapsulation layer OL may include an organic material. The organic material may include at least one of, for example, polyacrylate, polyethylene terephthalate, polyethylene naphthalate, polycarbonate, polyimide, polyethylene sulfonate, polyoxymethylene, and polyarylate, but the inventive concept is not limited thereto.

The organic encapsulation layer OL may have a thickness (e.g., a predetermined thickness) and may serve as a protection layer protecting the organic light emitting device OEL from an external impact. In addition, the organic encapsulation layer OL may serve as a planarization layer providing a flat top surface.

The second inorganic encapsulation layer IOL2 may be provided on the organic encapsulation layer OL. The second inorganic encapsulation layer IOL2 may be directly provided on the organic encapsulation layer OL. The second inorganic encapsulation layer IOL2 may be provided to be overlapped with the organic light emitting device OEL and the pixel definition layer PDL. The second inorganic encapsulation layer IOL2 may be overlapped (e.g., wholly overlapped) with the first inorganic encapsulation layer IOL1, when viewed in a plan view.

The second inorganic encapsulation layer IOL2 may include an inorganic material. The second inorganic encapsulation layer IOL2 may be an inorganic thin film containing an inorganic material. In an embodiment, the second inorganic encapsulation layer IOL2 may include the same inorganic material as that of the first inorganic encapsulation layer IOL1. For example, the second inorganic encapsulation layer IOL2 may include at least one of silicon oxide (SiOx), silicon nitride (SiNx), or silicon oxynitride (SiOxNy). The second inorganic encapsulation layer IOL2 may be used to seal the organic light emitting device OEL and may also serve as a barrier layer preventing or substantially preventing an extraneous material from infiltrating into the organic light emitting device OEL. The second inorganic encapsulation layer IOL2 may serve as a barrier layer preventing or substantially preventing an extraneous material from being infiltrated into the organic encapsulation layer OL.

Figure 4A:
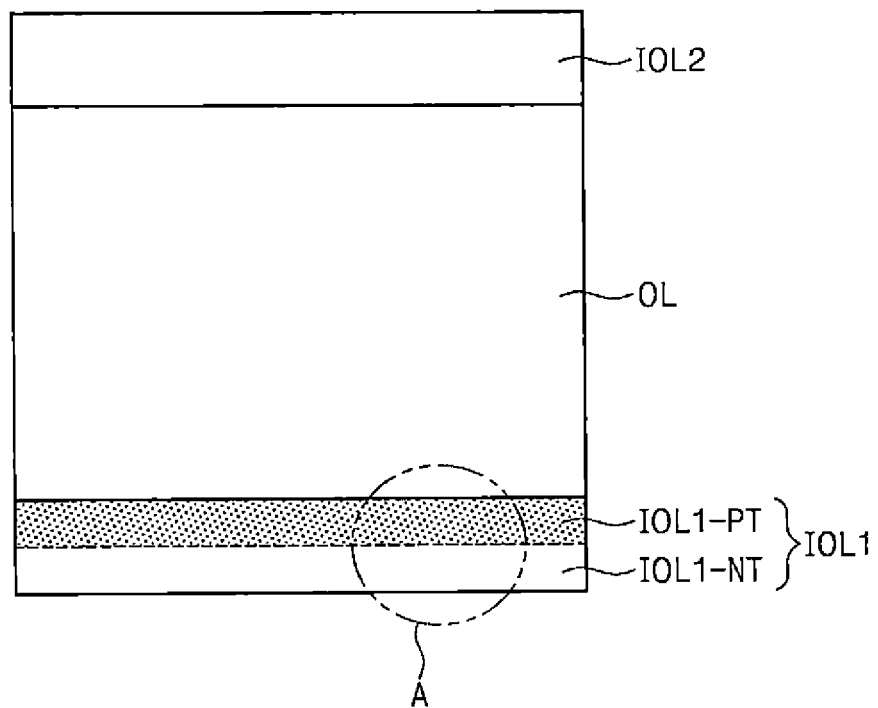
FIGS. 4A to 4C are cross-sectional views each schematically illustrating an encapsulation structure of the display device shown in FIG. 3.
Figure 4B:
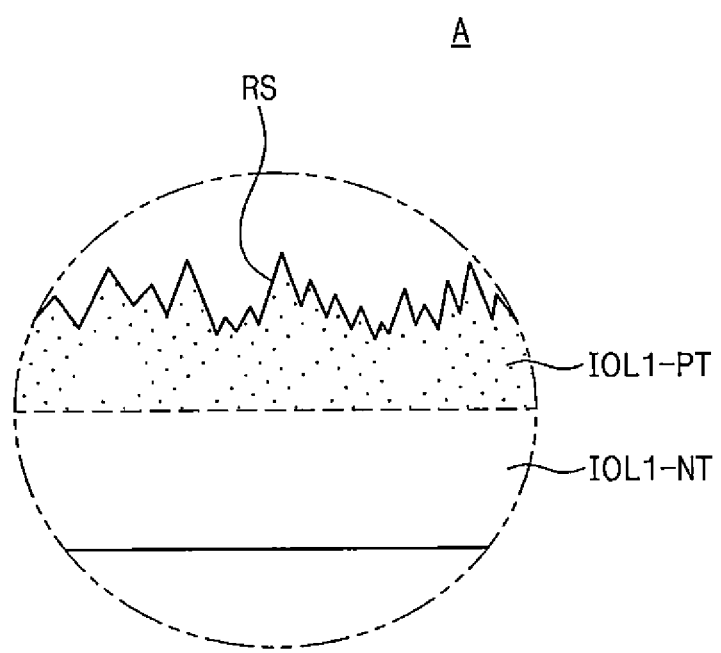
Figure 4C:
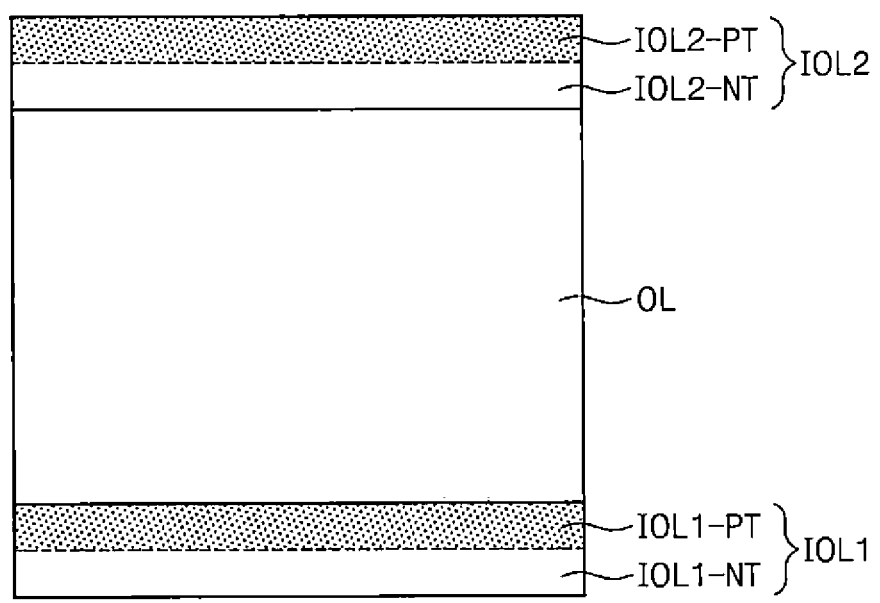

FIG. 4A is a cross-sectional view schematically illustrating a portion of a vertical section of the encapsulation structure of the display device shown in FIG. 3. FIG. 4B is an enlarged cross-sectional view of a region "A" of FIG. 4A. FIG. 4C is a cross-sectional view schematically illustrating a portion of a vertical section of the encapsulation structure of the display device shown in FIG. 3, according to an embodiment. Herein, the encapsulation structure according to some embodiments of the inventive concept will be described with reference to FIGS. 4A to 4C.

Referring to FIGS. 4A and 4B, in the encapsulation structure according to some embodiments of the inventive concept, the first inorganic encapsulation layer IOL1 may include a first inorganic layer IOL1-NT and a first plasma-treated layer IOL1-PT.

The first inorganic layer IOL1-NT may be provided below the first plasma-treated layer IOL1-PT or may be provided as a lower layer of the first inorganic encapsulation layer IOL1. The first inorganic layer IOL1-NT may be provided adjacent to the organic light emitting device OEL (e.g., see FIG. 3). The first inorganic layer IOL1-NT may be in contact with the organic light emitting device OEL. The first inorganic layer IOL1-NT may be a lower portion of the first inorganic encapsulation layer IOL1 that is not treated by plasma.

The first plasma-treated layer IOL1-PT may be provided on the first inorganic layer IOL1-NT. The first plasma-treated layer IOL1-PT may be an upper portion of the first inorganic encapsulation layer IOL1 that is treated by plasma to have a deformed surface morphology. In an embodiment, the first plasma-treated layer IOL1-PT may be a layer that is treated by plasma of nitrogen trifluoride ($NF_3$) gas. In some embodiments, the first plasma-treated layer IOL1-PT may not be a separate layer which can be distinguished from the first inorganic layer IOL1-NT, and may form a single body together with the first inorganic layer IOL1-NT.

The first plasma-treated layer IOL1-PT may have higher hydrophobicity than the first inorganic layer IOL1-NT. The first plasma-treated layer IOL1-PT may be treated by plasma, and, as a result of the plasma treatment, the first plasma-treated layer IOL1-PT may have high hydrophobicity and a large contact angle, compared with the first inorganic layer IOL1-NT. Physical and chemical properties (e.g., hydrophobicity and contact angle) of the first plasma-treated layer IOL1-PT may be changed in a thickness direction of the first plasma-treated layer IOL1-PT. In further detail, the first plasma-treated layer IOL1-PT may have increasing hydrophobicity and contact angle with decreasing distance from a top surface thereof.

A rugged structure RS may be formed in an upper portion of the first plasma-treated layer IOL1-PT. The rugged structure RS may be defined on the top surface of the first plasma-treated layer IOL1-PT. The rugged structure RS may be defined on a surface that is spaced apart from the first inorganic layer IOL1-NT and is adjacent to the organic encapsulation layer OL. The organic encapsulation layer OL may be provided on the first plasma-treated layer IOL1-PT to be in contact with the rugged structure RS of the first plasma-treated layer IOL1-PT.

The rugged structure RS may be a structure including protruding and recessed patterns, which are randomly or irregularly arranged. The rugged structure RS may be formed by a process of treating an upper portion of the first inorganic encapsulation layer IOL1 using plasma.

The rugged structure RS may have a root mean square (RMS) surface roughness in a range from about 10 nm to about 90 nm. Here, the RMS surface roughness may be obtained by the root mean square (RMS) method in statistics.

According to some embodiments of the inventive concept, the display device may include the first plasma-treated layer IOL1-PT, which is formed by performing a plasma treatment on an upper portion of the first inorganic encapsulation layer IOL1. An upper portion of the first plasma-treated layer IOL1-PT may have the rugged structure RS, and the organic encapsulation layer OL may be in contact with the first inorganic encapsulation layer IOL1 through the rugged structure RS. Accordingly, even if each layer of the encapsulation structure of the display device is formed of a transparent material, the organic encapsulation layer OL may be recognized by an operator. In further detail, even if the organic encapsulation layer OL of the encapsulation structure is formed of a transparent polymer material (e.g., polyacrylate), the rugged structure RS of the first plasma-treated layer IOL1-PT, which is placed below the organic encapsulation layer OL, may allow the organic encapsulation layer OL to be recognized by an operator. Accordingly, even when a failure (e.g., reflow or unfilling) of an organic material occurs in a process of forming the organic encapsulation layer OL, it may be possible to recognize such failure (e.g., in an inspection step) and thereby to improve reliability of the display device.

The rugged structure RS may have a RMS surface roughness in a range from about 10 nm to about 90 nm. In a case in which the rugged structure RS has a mean roughness less than about 10 nm, the organic encapsulation layer OL, which is provided on the rugged structure RS, may not be recognized by an operator, and this may lead to a reduction in reliability of the display device. By contrast, in a case in which the rugged structure RS has a mean roughness larger than about 90 nm, it may be necessary to excessively perform the plasma treatment. In this case, the organic light emitting device may be damaged or an additional process may be required. Furthermore, in the case in which the rugged structure RS has a mean roughness larger than about 90 nm, the organic light emitting device may suffer from low optical efficiency, owing to the excessively uneven shape of the rugged structure RS.

Referring to FIG. 4C, in an embodiment, the second inorganic encapsulation layer IOL2 may include a second inorganic layer IOL2-NT and a second plasma-treated layer IOL2-PT.

The second inorganic layer IOL2-NT may be a lower layer of the second inorganic encapsulation layer IOL2. The second inorganic layer IOL2-NT may be a layer that is adjacent to and in contact with the organic encapsulation layer OL. The second inorganic layer IOL2-NT may be a lower portion of the second inorganic encapsulation layer IOL2 that is not treated by plasma.

The second plasma-treated layer IOL2-PT may be provided on the second inorganic layer IOL2-NT. The second plasma-treated layer IOL2-PT may be an upper portion of the second inorganic encapsulation layer IOL2 that is treated by plasma to have a deformed surface morphology. In an embodiment, the second plasma-treated layer IOL2-PT may be a layer that is treated by plasma of nitrogen trifluoride ($NF_3$) gas. However, the inventive concept is not limited thereto, and, in an embodiment, the second plasma-treated layer IOL2-PT may be a layer that is treated by plasma of hydrogen ($H_2$) gas. In some embodiments, the second plasma-treated layer IOL2-PT may not be a separate layer which can be distinguished from the second inorganic layer IOL2-NT, and may form a single body together with the second inorganic layer IOL2-NT.

The second plasma-treated layer IOL2-PT may have higher hydrophobicity than the second inorganic layer IOL2-NT. The second plasma-treated layer IOL2-PT may be treated by plasma, and, as a result of the plasma treatment, the second plasma-treated layer IOL2-PT may have high hydrophobicity and a large contact angle, compared with the second inorganic layer IOL2-NT.

Although not shown, a rugged structure may be formed in an upper portion of the second plasma-treated layer IOL2-PT. The rugged structure may be defined on a top surface of the second plasma-treated layer IOL2-PT. The rugged structure may be spaced apart from the second inorganic layer IOL2-NT and may be defined on a top surface of the second plasma-treated layer IOL2-PT. In an embodiment, the rugged structure of the second plasma-treated layer IOL2-PT may be formed to have a surface roughness that is less than or substantially equal to that of the first plasma-treated layer IOL1-PT. The rugged structure may be formed by a process of treating an upper portion of the second inorganic encapsulation layer IOL2 using plasma.

According to some embodiments of the inventive concept, both of lower and upper layers of the encapsulation structure (e.g., the first and second inorganic encapsulation layers IOL1 and IOL2) may have surfaces treated by plasma, and, thus, not only the first plasma-treated layer IOL1-PT, but also the second plasma-treated layer IOL2-PT, may be formed in the encapsulation structure. Since the second plasma-treated layer IOL2-PT is further formed in the encapsulation structure of the display device, the organic encapsulation layer OL may be more easily recognized by an operator, compared to the case in which the encapsulation structure has only the first plasma-treated layer IOL1-PT. This may make it possible to improve reliability of the display device.

Herein, a method of fabricating a display device, according to some embodiments of the inventive concept, will be described.

Figure 5:
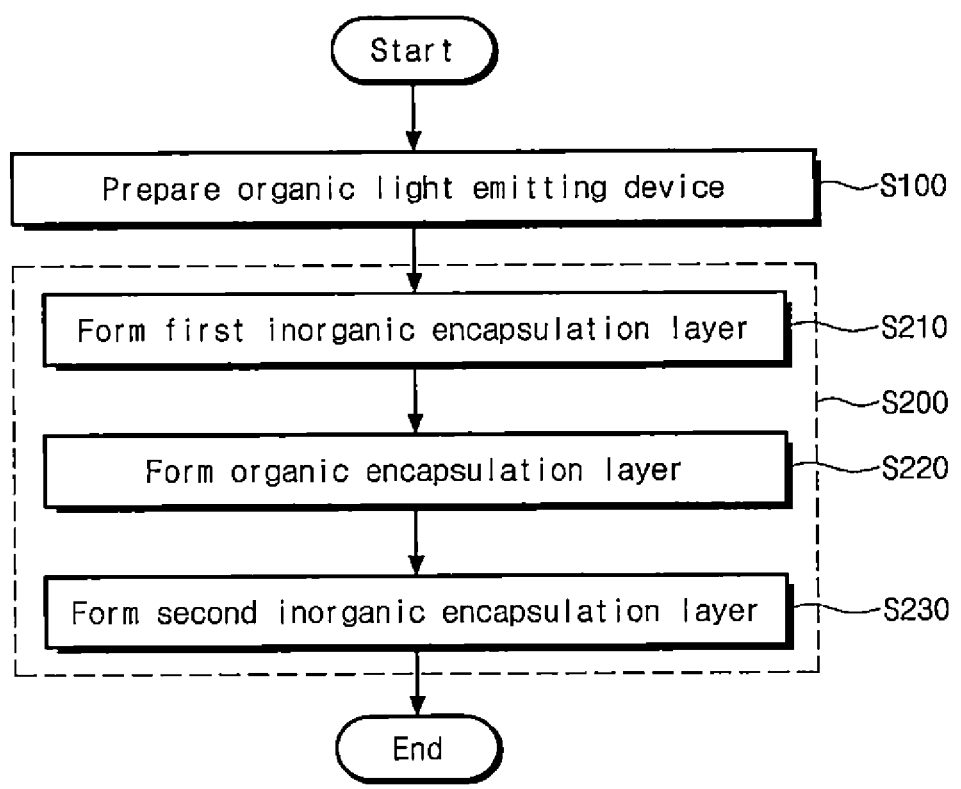
FIG. 5 is a flowchart illustrating a method of fabricating a display device according to some embodiments of the inventive concept.

FIG. 5 is a flowchart illustrating a method of fabricating a display device according to some embodiments of the inventive concept. FIGS. 6A to 6E are cross-sectional views sequentially illustrating a method of fabricating a display device according to some embodiments of the inventive concept.

Referring to FIG. 5, a method of fabricating a display device according to some embodiments of the inventive concept may include preparing a display structure (in S100) and forming an encapsulation structure on the display structure (in S200). The display structure may include an organic light emitting device. The encapsulation structure may be formed to seal the organic light emitting device.

The formation of the encapsulation structure may include forming a first inorganic encapsulation layer IOL1 (in S210), forming an organic encapsulation layer OL (in S220), and forming a second inorganic encapsulation layer IOL2 (in S230).

FIGS. 6A to 6E are sectional views sequentially illustrating a method of fabricating an encapsulation structure of a display device according to some embodiments of the inventive concept. Herein, a method of fabricating an encapsulation structure, according to some embodiments of the inventive concept, will be described with reference to FIGS. 6A to 6E.

Figure 6A:
FIGS. 6A to 6E are cross-sectional views sequentially illustrating a method of fabricating a display device according to some embodiments of the inventive concept.
Figure 6B:
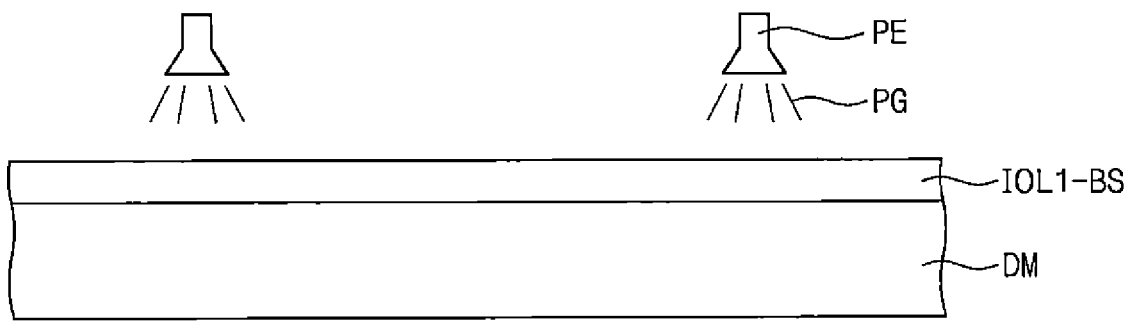

Referring to FIGS. 6A and 6B, the formation of the encapsulation structure may include preparing a display structure DM and depositing an inorganic material on the display structure DM to form a first base inorganic layer IOL1-BS. Although not shown, the display structure DM may include a base member BS and a display layer DL, as shown in FIG. 3. The base member BS and the display layer DL may be configured to have substantially the same features as those described with reference to FIG. 3.

Figure 6C:
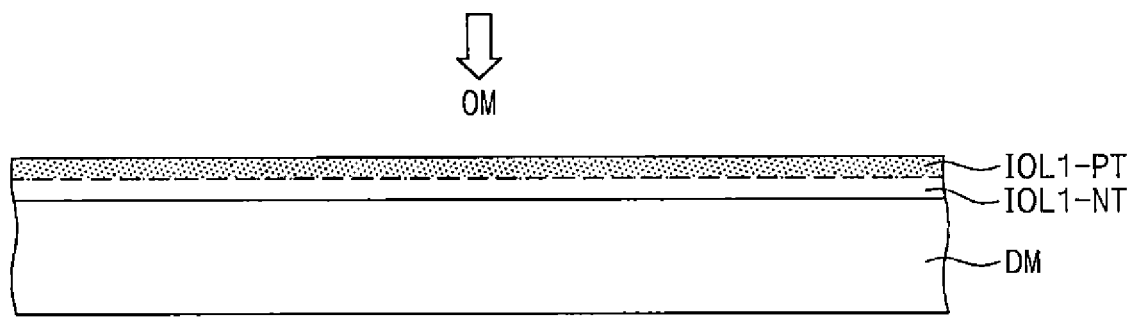

Referring to FIGS. 6B and 6C, a plasma treatment may be performed on a surface of the first base inorganic layer IOL1-BS. In an embodiment, a plasma treatment system PE may be a plasma etching system. In an embodiment, in the plasma treatment on the surface of the first base inorganic layer IOL1-BS, a nitrogen trifluoride ($NF_3$) gas may be used as a plasma gas PG. In the case in which the plasma treatment is performed on the surface of the first base inorganic layer IOL1-BS, a first plasma-treated layer IOL1-PT may be formed in an upper portion of the first base inorganic layer IOL1-BS. A lower portion of the first base inorganic layer IOL1-BS, which is not processed by the plasma treatment, may be referred to as a first inorganic layer IOL1-NT.

In the case in which the plasma treatment is performed to form the first plasma-treated layer IOL1-PT, a rugged structure RS (e.g., see FIG. 4B) may be formed in a portion of the first base inorganic layer IOL1-BS exposed to the plasma in the plasma treatment.

Although not shown, the formation of the encapsulation structure may further include ashing the surface of the first base inorganic layer IOL1-BS, before the formation of the first plasma-treated layer IOL1-PT. In certain embodiments, the formation of the encapsulation structure may further include performing an ashing process to remove residue from the surface of the first base inorganic layer IOL1-BS, before the formation of the first plasma-treated layer IOL1-PT or before the plasma treatment on the surface of the first base inorganic layer IOL1-BS. This may make it possible to more efficiently form the rugged structure RS in an upper portion of the first plasma-treated layer IOL1-PT. For example, if the ashing process is performed to remove the residue from the surface of the first base inorganic layer IOL1-BS and then the plasma treatment is performed thereon, the rugged structure RS may be more efficiently formed by the plasma treatment.

Figure 6D:
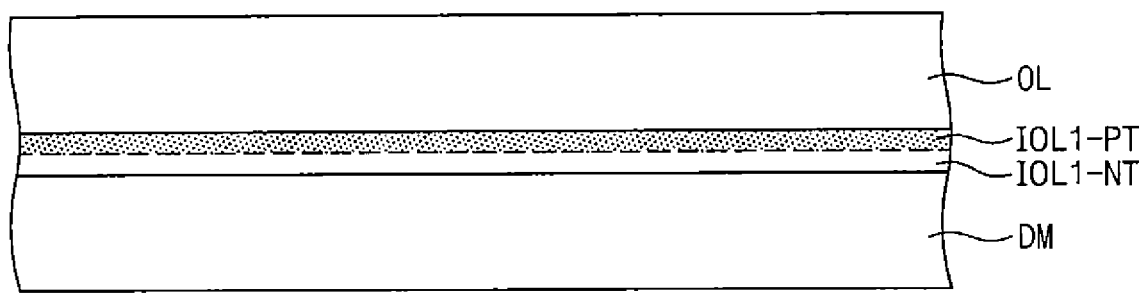

Referring to FIGS. 6C and 6D, the formation of the encapsulation structure may include coating an organic material OM on the first inorganic encapsulation layer IOL1 to form the organic encapsulation layer OL. The formation of the encapsulation structure may include coating the organic material OM on the first plasma-treated layer IOL1-PT to form the organic encapsulation layer OL.

The organic encapsulation layer OL may be formed by coating the organic material OM. The organic material OM for the organic encapsulation layer OL may be formed to a predetermined thickness, but the inventive concept is not limited thereto. The organic material OM may be a monomer for forming a polymer compound (e.g., polyacrylate, polyethylene terephthalate, polyethylene naphthalate, polycarbonate, polyimide, polyethylene sulfonate, polyoxymethylene, or polyacrylate). For example, the organic material OM may be an acryl-based monomer. The organic material OM may include at least one of a monoacrylate-based monomer, a diacrylate-based monomer, and a triacrylate-based monomer. In certain embodiments, the organic material OM may include 1,12-dodecanediol dimethacrylate.

In some embodiments, the organic encapsulation layer OL may be formed by directly coating the organic material OM on the first inorganic encapsulation layer IOL1 using an inkjet process. The organic material OM may be directly coated on the first plasma-treated layer IOL1-PT. The organic material OM may be directly coated on the rugged structure RS, which is formed in the upper portion of the first plasma-treated layer IOL1-PT.

Figure 6E:
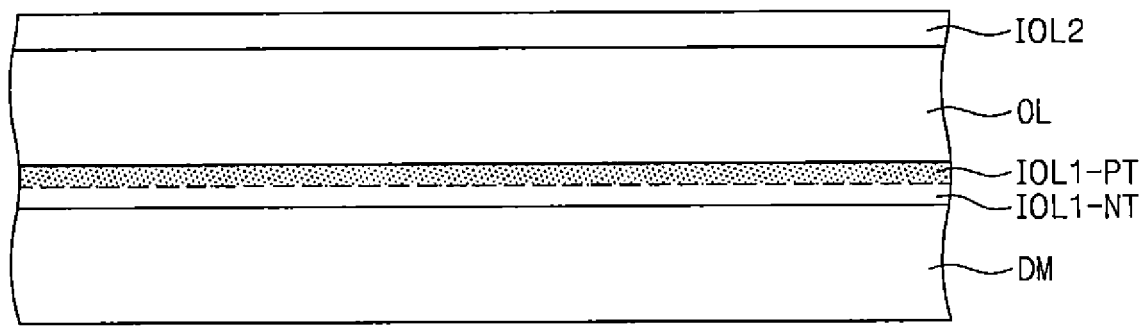

Referring to FIGS. 6D and 6E, the formation of the encapsulation structure may include forming the second inorganic encapsulation layer IOL2 on the organic encapsulation layer OL. The formation of the second inorganic encapsulation layer IOL2 may include depositing an inorganic material on the organic encapsulation layer OL. In an embodiment, the inorganic material for the second inorganic encapsulation layer IOL2 may be substantially the same as the inorganic material for the first inorganic encapsulation layer IOL1.

Although not shown, the second inorganic encapsulation layer IOL2 may include the second inorganic layer IOL2-NT and the second plasma-treated layer IOL2-PT (e.g., see FIG. 4C). The formation of the second inorganic encapsulation layer IOL2 may include depositing an inorganic material on the organic encapsulation layer OL to form a second base inorganic layer and performing a plasma treatment process on a surface of the second base inorganic layer to form the second plasma-treated layer IOL2-PT.

During the formation of the second plasma-treated layer IOL2-PT, a rugged structure may be formed in the surface of the second base inorganic layer by the plasma treatment process. The rugged structure, which is formed in the surface of the second plasma-treated layer IOL2-PT by the plasma treatment process, may have a surface roughness (e.g., a specific surface roughness). In an embodiment, the second plasma-treated layer IOL2-PT may have a surface roughness that is less than or equal to that of the first plasma-treated layer IOL1-PT. In an embodiment, nitrogen trifluoride ($NF_3$) gas may be used as a plasma gas for forming the second plasma-treated layer IOL2-PT. However, the inventive concept is not limited thereto, and, in an embodiment, hydrogen ($H_2$) gas may be used as a plasma gas for forming the second plasma-treated layer IOL2-PT.

Figure 7:
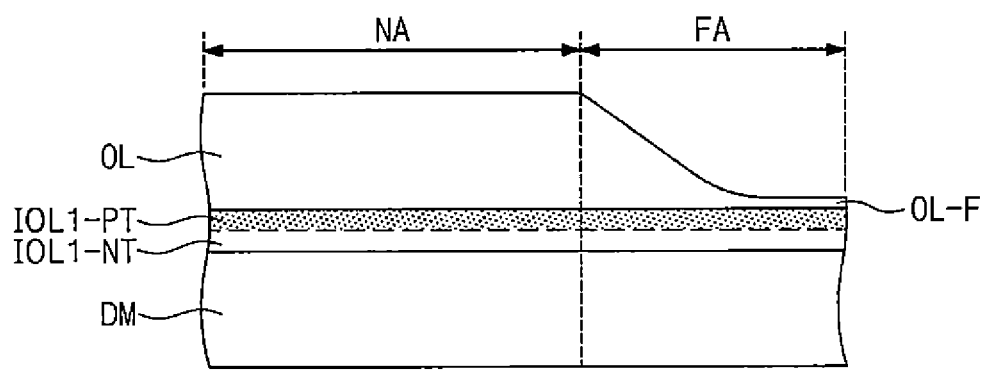
FIG. 7 is a cross-sectional view schematically illustrating an example of a process failure, which may occur in a process of fabricating a display device according to some embodiments of the inventive concept.

FIG. 7 is a cross-sectional view schematically illustrating an example of a process failure, which may occur in a process of fabricating a display device according to some embodiments of the inventive concept. In further detail, FIG. 7 schematically illustrates a case in which a failure occurs during the formation of the organic encapsulation layer OL of the encapsulation structure.

Referring to FIG. 7, a failure may occur in at least a region of the organic encapsulation layer OL during the formation of the organic encapsulation layer OL of the encapsulation structure, and, in this case, a failure region FA may be formed. For example, a failure (e.g., reflow or unfilling) of the organic material may occur, and, in this case, the organic encapsulation layer OL may be formed to have a non-uniform thickness on the failure region FA, unlike that on a normal region NA. The failure region FA may be a region on which an organic encapsulation layer OL-F with the failure is provided.

In the formation method of the encapsulation structure according to some embodiments of the inventive concept, the first plasma-treated layer IOL1-PT may be formed by performing a plasma treatment process on an upper portion of the first inorganic encapsulation layer IOL1, which is provided below the organic encapsulation layer OL. The rugged structure may be defined in an upper portion of the first plasma-treated layer IOL1-PT, and the organic encapsulation layer OL may be in contact with the first plasma-treated layer IOL1-PT through the rugged structure. Accordingly, even if each layer of the encapsulation structure of the display device is formed of a transparent material, an operator can recognize whether the failure region FA is formed in the organic encapsulation layer OL. In more detail, even if the organic encapsulation layer OL of the encapsulation structure is formed of a transparent material such as an acryl-based monomer, a stacking state of the organic encapsulation layer OL may be recognized by an operator, and, moreover, even if a failure (e.g., reflow or unfilling) of the organic material occurs during the formation of the organic encapsulation layer OL, such a failure may be recognized by an operator. This may make it possible to improve reliability of the display device.

Herein, some examples embodiments of the inventive concept and some comparative examples will be described in more detail below. The following embodiments are provided for better understanding of the inventive concept, but the inventive concept is not limited thereto.

Organic light emitting devices with encapsulation structures were fabricated according to example embodiments 1 to 3 of the inventive concept and comparative examples 1 and 2.

In the example embodiment 1, an encapsulation structure on an organic light emitting device had a triple-layered structure of a first inorganic encapsulation layer, an organic encapsulation layer, and a second inorganic encapsulation layer. A plasma treatment process using nitrogen trifluoride ($NF_3$) gas was performed on a surface of the first inorganic encapsulation layer of the encapsulation structure.

In the example embodiment 2, an ashing process was performed on the surface of the first inorganic encapsulation layer for 30 seconds, and, then, the plasma treatment process using nitrogen trifluoride ($NF_3$) gas was performed on the surface of the first inorganic encapsulation layer. In addition, a plasma treatment process using hydrogen ($H_2$) gas was further performed on a surface of the second inorganic encapsulation layer. Except for these differences, the device in the example embodiment 2 was fabricated to have the same structure as that in the example embodiment 1.

The device in the example embodiment 3 was fabricated to have the same structure as that in the example embodiment 2, except that the ashing process was performed for 60 seconds.

The device in the comparative example 1 was fabricated to have the same structure as that in the example embodiment 1, except that the plasma treatment process on the surface of the first inorganic encapsulation layer was performed using hydrogen ($H_2$) gas, not nitrogen trifluoride ($NF_3$).

The device in the comparative example 2 was fabricated to have the same structure as that in the example embodiment 1, except that the plasma treatment on the surface of the first inorganic encapsulation layer was not performed.

FIGS. 8A to 8E are images showing top surfaces of display devices according to the example embodiments 1 to 3 and the comparative examples 1 and 2.

Figure 8A:
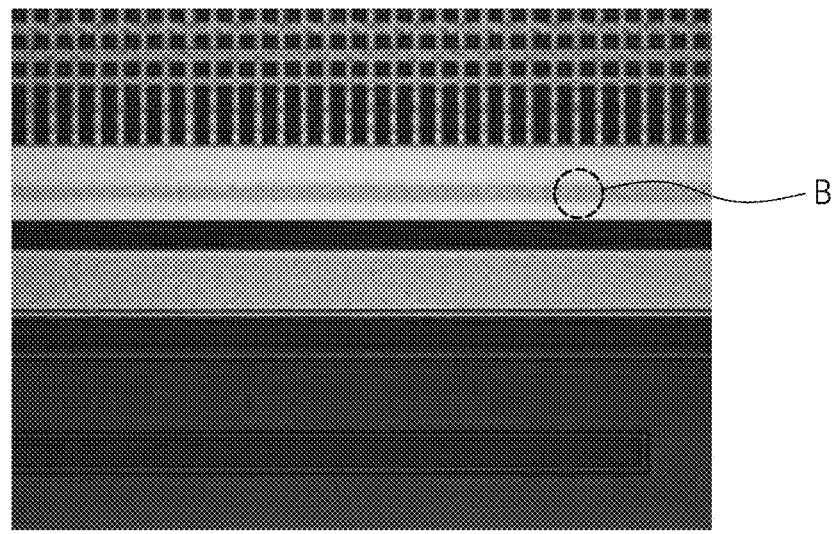
FIGS. 8A to 8E are images showing top surfaces of display devices according to some example embodiments and some comparative examples.
Figure 8B:
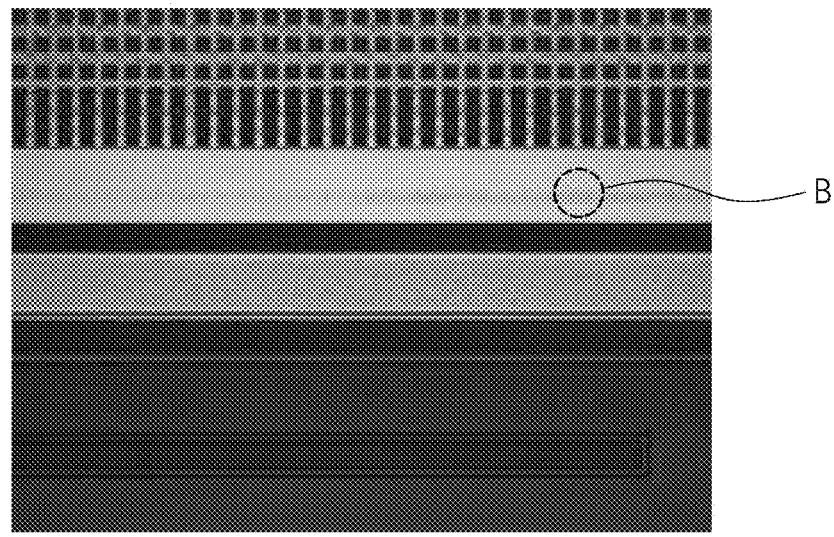
Figure 8C:
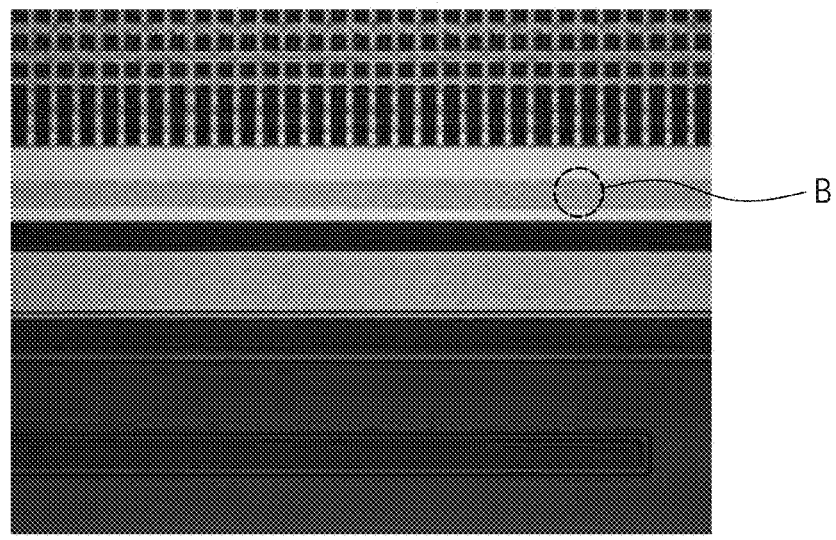
Figure 8D:
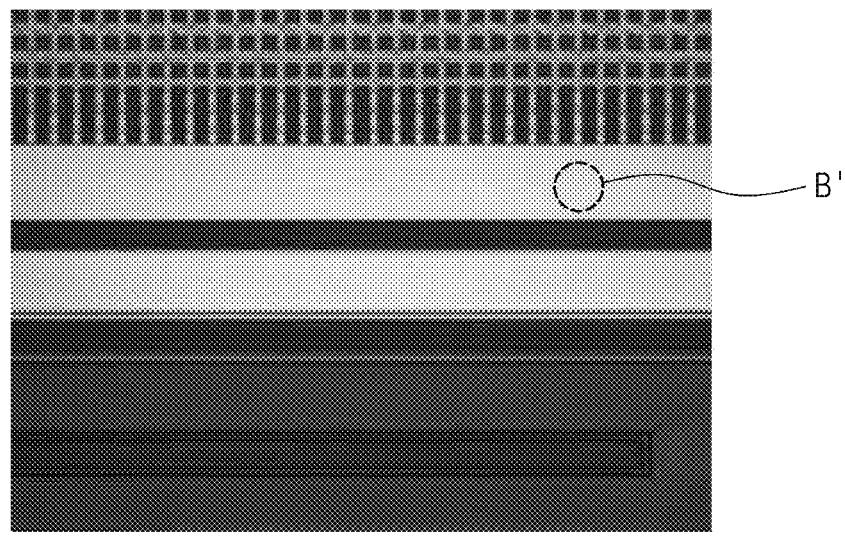
Figure 8E:
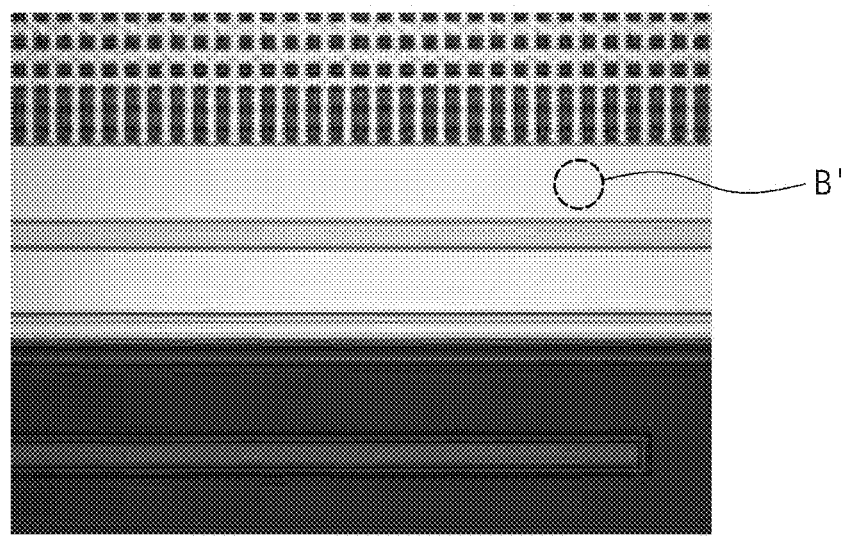

FIGS. 8A to 8C show that the organic encapsulation layer could be recognized (e.g., see region B) from the devices according to the example embodiments 1 to 3, respectively. By contrast, FIGS. 8D and 8E show that the organic encapsulation layer could not be recognized (e.g., see region B') from the devices of the comparative examples 1 and 2, respectively.

In the devices according to the example embodiments 1 to 3, since the plasma treatment process using nitrogen trifluoride ($NF_3$) gas was performed on the surface of the first inorganic encapsulation layer, a first plasma-treated layer, in which the rugged structure with a specific surface roughness is defined, was formed in an upper portion of the first inorganic encapsulation layer. Accordingly, the organic encapsulation layer on the first plasma-treated layer could be recognized by an external user. Especially, in the example embodiment 3, a residue was removed from the surface of the first inorganic encapsulation layer by the ashing process, which was performed before the plasma treatment process on the surface of the first inorganic encapsulation layer, and the plasma treatment process was also performed on the second inorganic encapsulation layer. Accordingly, the visibility of the organic encapsulation layer was further improved.

In the devices according to the example embodiments 1 to 3, the organic encapsulation layer was formed to be recognizable by an external user or operator. Thus, even if a failure (e.g., reflow or unfilling) of an organic material for the organic encapsulation layer occurs during a fabrication process, such a failure may be recognized by an external user or operator, and this may make it possible to improve reliability of the display device.

In the devices according to the comparative examples 1 and 2, the plasma treatment process was not performed on the first inorganic encapsulation layer or the plasma treatment using hydrogen ($H_2$) gas was performed on the first inorganic encapsulation layer. In this case, the rugged structure may not be formed in the surface of the first inorganic encapsulation layer or may be formed to have a reduced surface roughness, compared with those in the example embodiments. Accordingly, the organic encapsulation layer formed of a transparent material may not be recognized by an external user or operator, and, thus, even if a failure occurs in the organic encapsulation layer, such a failure may not be recognized by an external user or operator.

According to some embodiments of the inventive concept, a failure in an encapsulation structure may be recognized by an external user or operator, thereby improving reliability of a display device.

In a method of fabricating a display device according to some embodiments of the inventive concept, an encapsulation structure may be formed to allow an external user or operator to recognize a failure therein, and, thus, a display device with improved reliability may be fabricated.

While some embodiments of the inventive concept have been particularly shown and described, it will be understood by one of ordinary skill in the art that variations in form and detail may be made therein without departing from the spirit and scope of the inventive concept as set forth in the attached claims.

What is claimed is:

1. A display device comprising:
an organic light emitting device; and
an encapsulation structure on the organic light emitting device to seal the organic light emitting device,
wherein the encapsulation structure comprises:
a first inorganic encapsulation layer on the organic light emitting device;
an organic encapsulation layer on the first inorganic encapsulation layer; and
a second inorganic encapsulation layer on the organic encapsulation layer,
wherein the first inorganic encapsulation layer comprises:
a first inorganic layer on the organic light emitting device and covering the organic light emitting device; and
a first plasma-treated inorganic layer on the first inorganic layer and adjacent to the first inorganic layer, the first plasma-treated inorganic layer including an upper portion in which a rugged structure is defined, wherein the first inorganic layer comprises at least one of silicon oxide, silicon nitride, or silicon oxynitride and contacts an electrode of the organic light emitting device, and
wherein the second inorganic encapsulation layer comprises:
a second inorganic layer on the organic encapsulation layer; and
a second plasma-treated layer on the second inorganic layer, the second plasma-treated layer defining an outermost layer of the display device and including an upper portion in which a rugged structure is defined.

2. The display device of claim 1, wherein the rugged structure is defined in a surface that is spaced apart from the first inorganic layer and adjacent to the organic encapsulation layer.

3. The display device of claim 2, wherein the rugged structure has a root mean square surface roughness from 10 nm to 90 nm.

4. The display device of claim 1, wherein the organic encapsulation layer is in contact with a top surface of the first plasma-treated inorganic layer.

5. The display device of claim 4, wherein the organic encapsulation layer is in contact with the rugged structure of the first plasma-treated inorganic layer.

6. The display device of claim 1, wherein the first plasma-treated inorganic layer is treated by plasma of nitrogen trifluoride gas.

7. The display device of claim 1, wherein a hydrophobicity of the first plasma-treated inorganic layer is higher than a hydrophobicity of the first inorganic layer.

8. The display device of claim 1, wherein each of the first inorganic encapsulation layer and the second inorganic encapsulation layer comprises at least one of silicon oxide, silicon nitride, or silicon oxynitride.

9. The display device of claim 1, wherein the first plasma-treated inorganic layer forms a single body together with the first inorganic layer.

10. A method of fabricating a display device, the method comprising:
preparing an organic light emitting device; and
forming an encapsulation structure to seal the organic light emitting device,
wherein the forming of the encapsulation structure comprises:
forming a first inorganic encapsulation layer on the organic light emitting device;
coating the first inorganic encapsulation layer with an organic material to form an organic encapsulation layer; and
forming a second inorganic encapsulation layer on the organic encapsulation layer,
wherein the forming of the first inorganic encapsulation layer comprises:
depositing an inorganic material on the organic light emitting device and covering the organic light emitting device to form a first base inorganic layer, wherein the first base inorganic layer comprises at least one of silicon oxide, silicon nitride, or silicon oxynitride and contacts an electrode of the organic light emitting device; and
performing a plasma treatment process on a surface of the first base inorganic layer to form a first plasma-treated inorganic layer, and
wherein the forming of the second inorganic encapsulation layer comprises:
depositing an inorganic material on the organic encapsulation layer to form a second base inorganic layer; and
performing a plasma treatment process on a surface of the second base inorganic layer to form a second plasma-treated layer, the second plasma-treated layer defining an outermost layer of the display device and including an upper portion in which a rugged structure is defined.

11. The method of claim 10, wherein, in the forming of the first plasma-treated inorganic layer, the plasma treatment process is performed using nitrogen trifluoride gas.

12. The method of claim 10, wherein, in the forming of the first plasma-treated inorganic layer, the plasma treatment process is performed to form a rugged structure on a surface of the first base inorganic layer.

13. The method of claim 12, wherein the rugged structure is formed to have a root mean square surface roughness from 10 nm to 90 nm.

14. The method of claim 10, wherein the forming of the first inorganic encapsulation layer further comprises performing an ashing process on the surface of the first base inorganic layer, before the formation of the first plasma-treated inorganic layer.

15. The method of claim 10, wherein, in the forming of the organic encapsulation layer, the organic material is directly coated on the first inorganic encapsulation layer using an inkjet process.

16. A display device comprising:
an organic light emitting device; and
an encapsulation structure on the organic light emitting device to seal the organic light emitting device,
wherein the encapsulation structure comprises:
a first inorganic encapsulation layer on the organic light emitting device;
an organic encapsulation layer on the first inorganic encapsulation layer; and
a second inorganic encapsulation layer on the organic encapsulation layer,
wherein the second inorganic encapsulation layer comprises:
an inorganic layer on the organic encapsulation layer; and
a plasma-treated inorganic layer on the inorganic layer, the plasma-treated inorganic layer defining an outermost layer of the display device and including an upper portion in which a rugged structure is defined.

* * * * *